United States Patent
Jang et al.

(10) Patent No.: US 7,417,282 B2
(45) Date of Patent: Aug. 26, 2008

(54) VERTICAL DOUBLE-DIFFUSED METAL OXIDE SEMICONDUCTOR (VDMOS) DEVICE INCORPORATING REVERSE DIODE

(75) Inventors: Sung-Pil Jang, Yongin-si (KR); Han-Gu Kim, Seongnam-si (KR); Chan-Hee Jeon, Suwon-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 50 days.

(21) Appl. No.: 11/265,583

(22) Filed: Nov. 2, 2005

(65) Prior Publication Data

US 2006/0124994 A1   Jun. 15, 2006

(30) Foreign Application Priority Data

Dec. 15, 2004   (KR) ............ 10-2004-0106393

(51) Int. Cl.
*H01L 29/76* (2006.01)
*H01L 29/94* (2006.01)
*H01L 31/00* (2006.01)

(52) U.S. Cl. ............ 257/328; 257/135; 257/139; 257/168; 257/175; 257/341; 257/342; 257/E29.012; 257/E29.027; 257/E29.066

(58) Field of Classification Search ............ 257/168, 257/342, 341, 328, 135, 139, 175, E29.066, 257/E29.012, E29.027
See application file for complete search history.

(56) References Cited

U.S. PATENT DOCUMENTS 4,819,044 A   4/1989   Murakami 4,975,751 A * 12/1990   Beasom .............. 257/172

(Continued)

FOREIGN PATENT DOCUMENTS

JP   06-140632   5/1994

(Continued)

OTHER PUBLICATIONS

Office Action in German Patent Application 10 2005 061 378.0-33.

(Continued)

*Primary Examiner*—Michelle Estrada
*Assistant Examiner*—Jarrett J Stark
(74) *Attorney, Agent, or Firm*—F. Chau & Associates, LLC

(57) ABSTRACT

The present invention disclosed herein is a Vertical Double-Diffused Metal Oxide Semiconductor (VDMOS) device incorporating a reverse diode. This device includes a plurality of source regions isolated from a drain region. A source region in close proximity to the drain region is a first diffusion structure in which a heavily doped diffusion layer of a second conductivity type is formed in a body region of a second conductivity type. Another source region is a second diffusion structure in which a heavily doped diffusion layer of a first conductivity type and a heavily doped diffusion layer of the second conductivity type are formed in the body region of the second conductivity type. An impurity diffusion structure of the source region in close proximity to the drain region is changed to be operated as a diode, thereby forming a strong current path to ESD (Electro-Static Discharge) or EOS (Electrical Over Stress). As a result, it is possible to prevent the device from being broken down.

17 Claims, 3 Drawing Sheets

U.S. PATENT DOCUMENTS

| | | | |
|---|---|---|---|
| 5,814,860 A * | 9/1998 | Furuta | 257/335 |
| 5,877,527 A | 3/1999 | Okabe et al. | |
| 5,925,910 A | 7/1999 | Menegoli | 257/335 |
| 5,977,588 A * | 11/1999 | Patel | 257/328 |
| 6,133,107 A | 10/2000 | Menegoli | 438/306 |
| 6,194,761 B1 * | 2/2001 | Chiozzi et al. | 257/328 |
| 6,225,642 B1 | 5/2001 | Liao | |
| 6,365,932 B1 * | 4/2002 | Kouno et al. | 257/341 |
| 6,815,794 B2 * | 11/2004 | Shin et al. | 257/500 |
| 6,867,476 B2 * | 3/2005 | Lee | 257/549 |
| 6,894,350 B2 * | 5/2005 | Shimizu et al. | 257/343 |
| 6,927,452 B2 * | 8/2005 | Shin et al. | 257/335 |
| 7,095,084 B2 * | 8/2006 | Ronsisvalle | 257/378 |
| 2004/0119116 A1 * | 6/2004 | Byeon et al. | 257/335 |

FOREIGN PATENT DOCUMENTS

| | | |
|---|---|---|
| JP | 10-284731 | 10/1998 |
| JP | 2000-200902 | 7/2000 |
| JP | 2001127294 | 5/2001 |
| JP | 2003-303964 | 10/2003 |
| KR | 10-2004-0070692 A | 8/2004 |

OTHER PUBLICATIONS

English Abstract for Publication No. 06-140632.
English Abstract for Publication No. 2003-33964.

* cited by examiner

VERTICAL DOUBLE-DIFFUSED METAL OXIDE SEMICONDUCTOR (VDMOS) DEVICE INCORPORATING REVERSE DIODE

This application claims priority from Korean Patent Application No. 2004-106393, filed on Dec. 15, 2004, the contents of which is herein incorporated by reference in its entirety.

1. Field of the Invention

This invention generally relates to Double Diffused Metal Oxide Semiconductor (DMOS) devices and, more specifically, to a vertical DMOS device having a strong endurance to EOS (Electrical Over Stress) and ESD (Electrical-Static Discharge) with a reverse diode.

2. Background of the Invention

DMOS devices are high-voltage devices with low power consumption and high speed. The DMOS devices are classified into Lateral Double-Diffused Metal Oxide Semiconductor (LDMOS) and Vertical Double-Diffused Metal Oxide Semiconductor (VDMOS). The VDMOS occupies a smaller area compared to the LDMOS, but cannot endure EOS and ESD.

A DMOS device with an operation voltage higher than several volts increases a breakdown voltage by doping a source region and a drain region with a low concentration. As a result of a low doping concentration of the source and drain regions, a current crowding induced by base push-out phenomenon occurs, thereby bringing about a thermal breakdown of the device. In particular, a lateral bipolar transistor is first operated between a drain region and a source region which is in close proximity to the drain region. Consequently, a stronger snapback occurs in a lower voltage than a normal voltage, resulting in an VDMOS whose endurance to ESD and EOS is weakened.

FIG. 1 illustrates a structure and a breakdown mechanism of a conventional DMOS device.

With reference to FIG. 1, the conventional VDMOS device includes an epitaxial layer 14 of a first conductivity type formed on a semiconductor substrate 10, and a buried diffusion layer 12 formed at a boundary between the epitaxial layer 14 and the semiconductor substrate 10. A device isolation layer 16 is formed on the epitaxial layer 14 to separate laterally a source region and a drain region, and a sink region of the first conductivity type is formed in the epitaxial layer 14. The sink region of the first conductivity type is extended from the drain region 18 to the buried diffusion layer 12.

The DMOS device includes a plurality of source regions 25, which are isolated laterally. Each of source regions 25 comprises a body region of a second conductivity type 20 at an upper part of the epitaxial layer 14, a heavily doped diffusion layer of the first conductivity type 22 formed in the body region 20, and a heavily doped diffusion layer of a second conductivity type 24. The upper part of the body region 20 between the heavily doped diffusion layer of first conductivity type 22 and the epitaxial layer 20 is provided as a channel of a DMOS transistor.

A gate electrode 30 is formed by interposing a gate insulating layer 26 on the epitaxial layer 14. The gate electrode 30 overlaps with an upper portion of the body region 20, which is provided as a channel of a DMOS transistor. A drain contact plug 34 and a source contact plug 32 are connected to the drain region 18 and the source region 25, respectively.

Under a normal operation voltage, a voltage is applied through a low resistance path including a drain region 18, the sink region 20 and the buried diffusion layer 12 to the epitaxial layer 14 in the DMOS device. A channel is formed at the upper part of the body region 20 between a first heavily doped diffusion layer 22 and the epitaxial layer 14. Since the DMOS device has a plurality of source regions 25, a plurality of DMOS transistor cellsare connected in parallel to combine sourcing a total current of the DMOS device so that the current is distributed among the cells . As a result, the breakdown of the device can be prevented.

If a voltage applied to the drain region is increased, a vertical bipolar transistor is operated so that charges are transferred through the buried diffusion layer 12 and the sink region 19 to the drain region 18. The vertical bipolar transistor includes the heavily doped diffusion layer 22 of the first conductivity type 22 as an emitter region, the body region of the second conductivity type as a base region, and the epitaxial layer of the first conductivity type 14 as a collector region. If a horizontal distance between a source region 25a, which is in close proximity to the drain region 18 is not sufficient, and a strong current such as ESD or EOS flows into the DMOS device, a lateral bipolar transistor T1 is previously turned on in a lower voltage than the turn-on voltage of the vertical bipolar transistor. Consequently, a stronger snapback occurs in a lower voltage than a normal first snap voltage, so that a large amount of current momentarily flows into the base region of the horizontal bipolar transistor T1. In the event that a doping concentration of the source region is low, to have high operation voltage range, a current crowding is induced by a base push-out, and a thermal breakdown of the DMOS device occurs.

SUMMARY OF THE INVENTION

Exemplary embodiments according to the invention are directed to a DMOS device which is able to prevent a breakdown from a strong current stress such as ESD or EOD.

Some exemplary embodiments according to the invention provide a DMOS device which prevents a strong current from being concentrated on a portion that cannot endure a current stress by redistributing the strong current momentarily generated.

In some other exemplary embodiments according to the invention, a DMOS device incorporating a reverse diode is provided. This DMOS device includes a plurality of source regions isolated from the drain region. One source region in close proximity to the drain region is a first diffusion structure in which a heavily doped diffusion layer of a second conductivity type is formed in the body region of the second conductivity type. Other source regions are a second diffusion structure in which a heavily doped diffusion layer of a first conductivity type and a heavily doped diffusion layer of the second conductivity type are formed in the body region of the second conductivity type.

The source regions are connected with interconnections to each other, and thus, a ground voltage may be applied. A source region of the first diffusion structure and the drain region form a diode. A source region of a second diffusion structure and the drain region form a bipolar transistor. Thus, before a reverse breakdown of the diode occurs in the source region in close proximity to the drain region, bipolar transistors are turned on in other source regions that are sufficiently isolated from the drain region. As a result, a stress current may be redistributed.

A gate electrode of the DMOS device according to the present invention is overlapped with a part of the source region. A channel of a MOS transistor is defined in the body region of the second conductivity type of the second diffusion structure by the gate electrode. A threshold voltage of the MOS transistor is lower than a turn-on voltage of the bipolar transistor, and a turn-on voltage of the bipolar transistor is lower than a reverse breakdown voltage of the diode. Due to theses characteristics, the breakdown of the DMOS device can be prevented under a normal operation voltage and with the occurrence of a strong current such as ESD or EOD, when for example a high-power DMOS transistor with a channel formed in the body region is operatedand a bipolar transistor is operated in the source region sufficiently isolated from the drain region.

The DMOS device according to an exemplary embodiment includes an epitaxial layer of the first conductivity type formed in a substrate, a buried diffusion layer of the first conductivity type formed at a boundary of the epitaxial layer and the substrate, a drain region of the first conductivity type formed on a surface of the epitaxial layer, a sink region of the first conductivity type extended from the drain region to the buried diffusion layer, and a plurality of source regions isolated from the drain region to be formed on the surface of the epitaxial layer.

The source regions comprises: a first source region including a first body region of the second conductivity type and a first heavily doped diffusion layer of the second conductivity type formed in the first body region, and a second source region including a second body region, a first heavily doped diffusion layer of the first conductivity type formed in the second body region, and a second heavily doped diffusion layer of the second conductivity type. In this case, a source region in close proximity to the drain region is a first source region.

The source regions are connected to each other with interconnections, and thus, a ground voltage may be applied to the first and second source regions. A reverse diode may comprise the epitaxial layer of the first conductivity type and the source region of the second conductivity type. A bipolar transistor may comprise the epitaxial layer of the first conductivity type, the second body region of the second conductivity type, and heavily doped diffusion layer of the first conductivity type in the second source region. The bipolar transistor includes the heavily doped diffusion layer of the first conductivity type as an emitter region, the second body region as a base region, and the epitaxial layer as a collector region. Since a turn-on voltage of the bipolar transistor is lower than a reverse breakdown voltage of the diode, bipolar transistors may be turned on before a breakdown occurs in the diode so that a current may be redistributed.

The DMOS device further includes a gate insulating layer and a gate electrode, which are formed on the epitaxial layer. The gate electrode is overlapped with the first and second body region. The first body region is located between the first heavily doped diffusion layer of the second conductivity type and the epitaxial layer, and the second body region is located between the heavily doped diffusion layer of the first conductivity type and the epitaxial layer. A channel of a Metal Oxide Semiconductor (MOS) transistor is defined by the gate electrode in the second body region between the heavily doped diffusion layer of the first conductivity type and the epitaxial layer. A threshold voltage of the MOS transistor is lower than a turn-on voltage of the bipolar transistor. Therefore, under a normal operation voltage, the MOS transistor is operated, and under a high voltage, the bipolar transistor is turned on before a breakdown occurs in the diode. As a result, a current is redistributed.

DETAILED DESCRIPTION OF PREFERRED EMBODIMENTS

Figure 1:
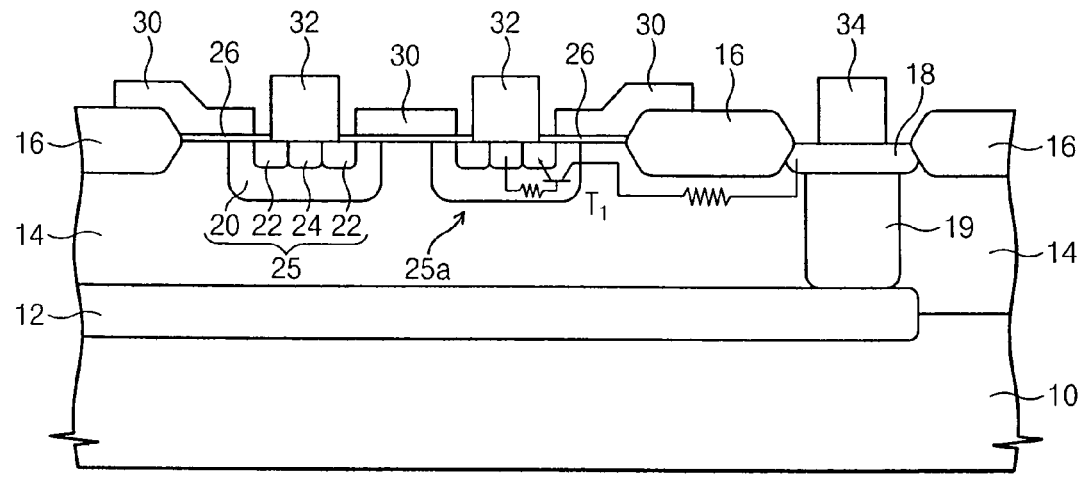
FIG. 1 shows a conventional VDMOS device.

The exemplary embodiments of the present invention now will be described more fully hereinafter with reference to the accompanying drawings, in which embodiments of the invention are shown. However, this invention should not be construed as limited to the embodiments set forth herein. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. Moreover, the term "heavily doped" used herein refers to a higher than average concentration. Like numbers refer to like elements throughout the specification.

Figure 2:
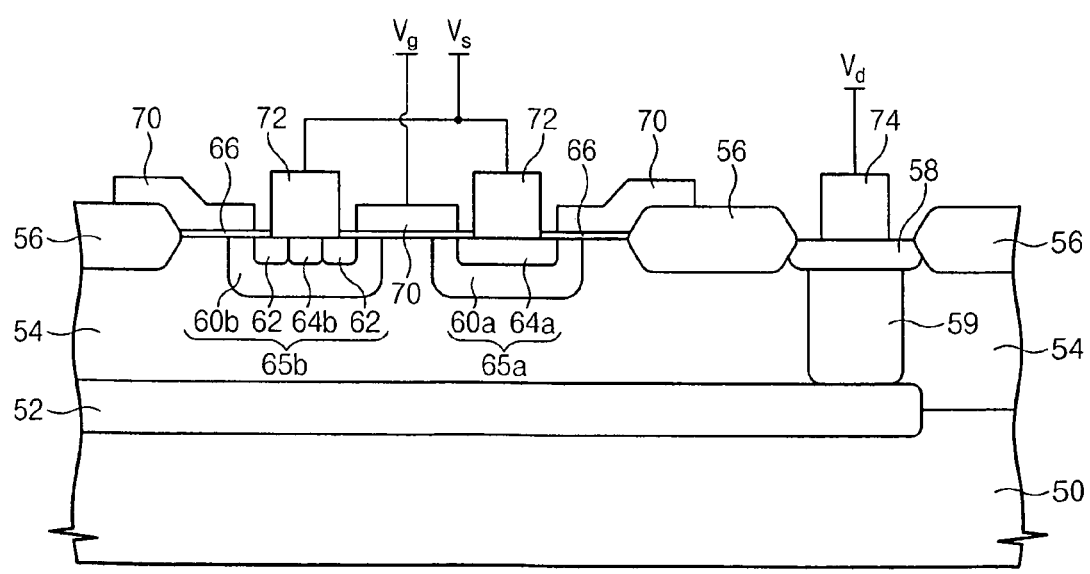
FIG. 2 shows a VDMOS device according to an exemplary embodiment of the present invention.

FIG. 2 shows a VDMOS device according to a preferred embodiment of the present invention.

With reference to FIG. 2, the VDMOS includes an epitaxial layer of a first conductivity type on a semiconductor substrate 50 and a buried diffusion layer 52 of the first conductivity type at a boundary of the epitaxial layer of the first conductivity type and the semiconductor substrate 50. Preferably, the epitaxial layer is doped with a low concentration (i.e. lower than average concentration), and the buried diffusion layer 52 is doped with a high concentration (i.e. higher than average concentration) so as to provide a low resistance path for the DMOS device. A device isolation layer 56 is formed in the epitaxial layer to separate a drain region and a plurality of source regions in a width direction. A first conductivity type impurity is implanted into the epitaxial layer to form a drain region 58 of first conductivity type. A sink region 59 of first conductivity type is extended to the buried diffusion layer under the drain region 58. A plurality of source regions are formed on a surface of the epitaxial layer 54 isolated from the drain region 58. The source regions are classified into two structures. A first source region 65a includes a first body region 60a of the second conductivity type formed in the epitaxial layer 54 and a first heavily doped diffusion layer 64a of a second conductivity type. The second source region 65b includes a second body region 60b of the second conductivity type formed in the epitaxial layer 54, a heavily doped diffusion layer of the first conductivity type 62 formed in the second body region 60b, and a second heavily doped diffusion layer of a second conductivity type 64b. Among the plurality of source regions is the first source region 65a which is in close proximity to the drain region 58, and the secondr source region 65b which is isolated from the drain region 58.

A gate electrode 70 is formed by interposing a gate insulating layer 66 on the epitaxial layer 54. The gate electrode 70 is overlapped with a part of the source regions. As shown in FIG. 2, the gate electrode 70 is overlapped with an upper portion of the second body region 60b between the heavily doped diffusion layer 62 of the first conductivity type and the epitaxial layer 54. The DMOS device includes a plurality of DMOS transistor cells, which are connected in parallel. A channel of the DMOS device is defined on a surface of the second body region 60b. A drain contact plug 74 is connected to the drain region. A source contact plug 72 is connected to the first and second source regions 65a and 65b, respectively.

The first and second source regions 65a and 65b are connected to each other with interconnections. For example, when a load voltage Vd is applied to the drain contact plug 74, a control signal Vg is applied to the gate electrode 70, and a ground voltage Vs is applied to the source contact plug 72 under a normal operation voltage, a channel is formed on the surface of the second body region 60b, thereby turning on the DMOS transistor cell.

Figure 3:
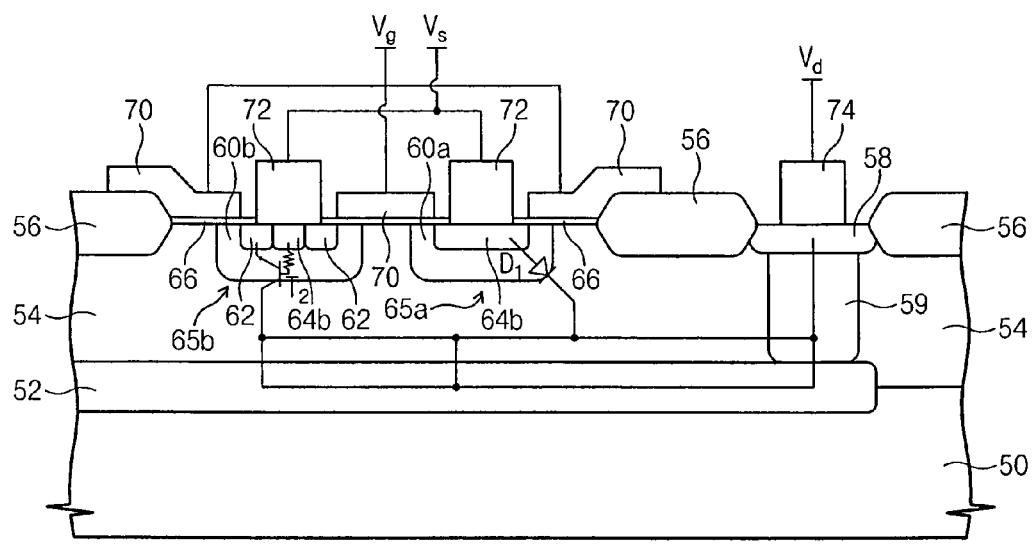
FIG. 3 explains an operation of the VDMOS according to an exemplary embodiment of the present invention.

FIG. 3 illustrates an operation of VDMOS according to a preferred embodiment of the present invention.

With reference to FIG. 3, this DMOS device includes a diode D1 and a vertical bipolar transistor T2. The diode D1 includes the first source region 65a and the epitaxial layer 54. The vertical bipolar transistor T2 includes the second source region 65b and the epitaxial layer 54. In the case of a N-type DMOS device, the diode D1 includes the first source region 65a of the second conductivity type as an anode region and the epitaxial layer of the first conductivity type 54 as a cathode region. Also, the bipolar transistor T2 includes a heavily doped diffusion layer of the first conductivity type 62 as an emitter region, a second body region of the second conductivity type 60b as a base region, and the epitaxial layer of the first conductivity type 54 as a collector region. The first and second source regions 65a and 64b are connected to each other with interconnections and accordingly, the same bias is applied. Thus, an equivalent circuit structure in which the emitter region of the bipolar transistor T2 is electrically connected to the anode region of the diode D1 is formed.

Under a normal operation voltage, when a load voltage Vd, a control signal Vg, and a ground voltage Vs are respectively applied to the drain contact plug 74, the gate electrode 70, and the source contact plug 72, the load voltage Vd is applied through a low resistance path including the sink region 59 and the buried diffusion layer 53 to the epitaxial layer 54. A channel is formed on a surface of the second body region 60b between the heavily doped diffusion layer of the first conductivity type 62 and the epitaxial layer 54, so that DMOS transistor cell is turned on. Since a reverse breakdown voltage of the diode D1 is sufficiently higher than the turn-on voltage of the DMOS transistor, a current flows along a low resistance path connected to the sink region 59 and the buried diffusion layer 52. Also, a current path is formed in vertical to the epitaxial layer and accordingly, a current flows through the channel of the DMOS transistor.

If a voltage applied to the drain region 58 is increased more than the turn-on voltage of the bipolar transistor T2, irrespective of whether the control signal Vg is applied to the gate electrode 70, the bipolar transistor T2 is turned on. As a result, the current flowing through the channel of the DMOS transistor flows vertically through the second body region 60b. Since a current flows along the low resistance path under a high voltage, it is possible to prevent a surface current density from being increased at the source region neighboring the drain region 58. It is preferable that the breakdown voltage of the diode D1 is higher than the turn-on voltage of the bipolar transistor T2.

In a conventional DMOS device, when a strong current such as ESD or EOS inflows, a horizontal bipolar transistor (see T1 of FIG. 1) between the drain region and neighboring source region is turned on in advance under a lower voltage than the turn-on voltage of the vertical bipolar transistor T2. For this reason, a large amount of current is momentarily concentrated on the source region 25a, thereby causing a thermal breakdown of the device. However, with exemplary embodiments of the present invention a reverse diode is operated to the source region close to the drain region 58, and thus a current is not concentrated on the first source region close to the drain region, but rather a current path is formed through the buried diffusion layer 52 to the second source region 60b.

Accordingly, ESD pulse with short duration time owing to turn-on of the vertical bipolar transistor T2 can be discharged effectively. In an EOS surge in which a large amount of charges inflow, a current is divided into the bipolar transistor T2 and the diode D1, and thus current crowding can be suppressed. In other words, a current is limited by increasing the current of the bipolar transistor T2 and the on-resistance. Then, if a voltage is increased again by the current limitation of the bipolar transistor T2 and increment of the resistance, a diode is broken down so that a current path is changed to the diode D1. If the on-resistance of the bipolar transistor T2 is decreased, and the bipolar transistor T2 is turned on, a current path is changed from the diode D1 to the bipolar transistor T2. Through performing these processes repeatedly, a current crowding by the EOS surge can be suppressed.

The breakdown voltage of the diode D1 may be decreased by lowering of a doping concentration. Conventionally, there is a limitation to the lowering a doping concentration of a body region as a base region of the bipolar transistor due to a current crowding by a base push-out. However, with exemplary embodiments of the present invention, since a source region that cannot endure ESD or EOS is operated as a diode, a current is divided even though a base concentration of the bipolar transistor is decreased. As a result, it has a sufficient endurance with respect to a thermal breakdown of the device.

Figure 4:
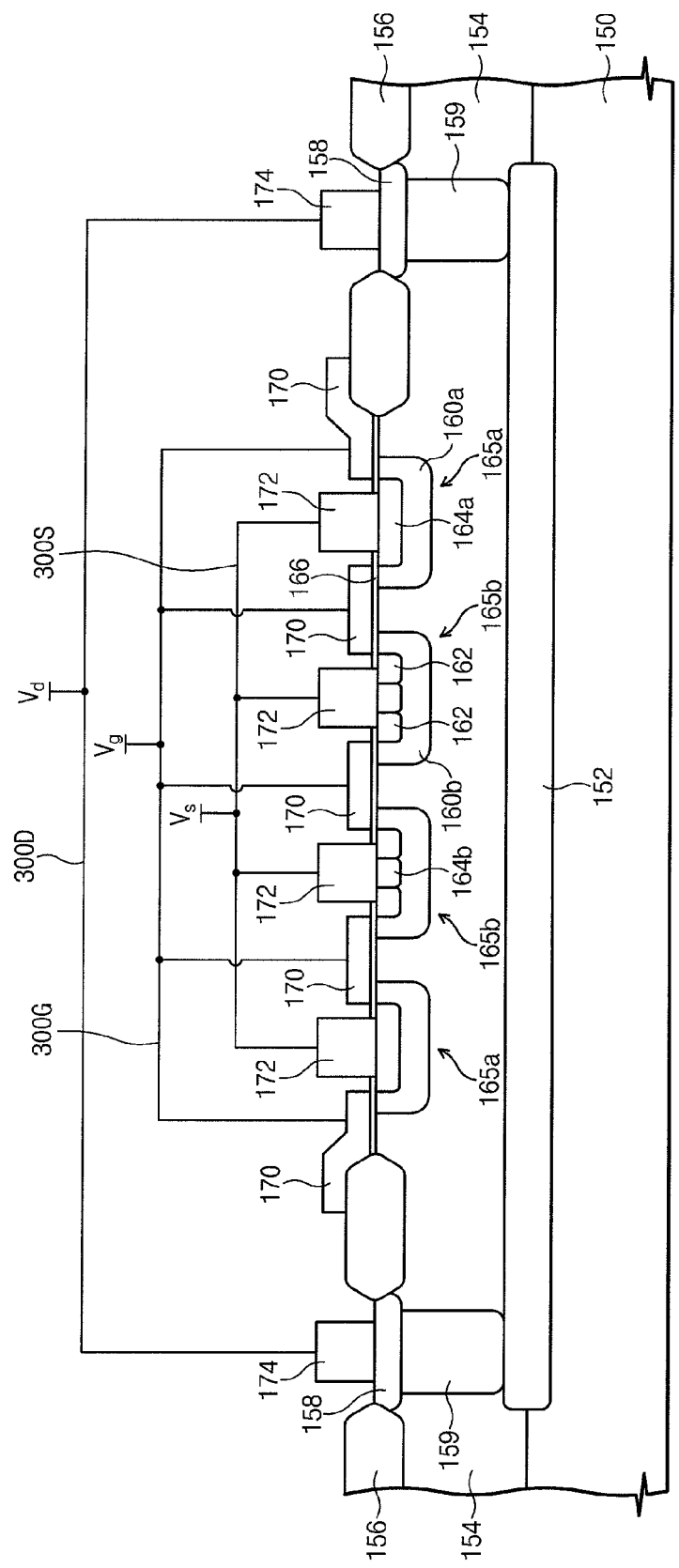
FIG. 4 shows a VDMOS according to an exemplary embodiment of the present invention.

FIG. 4 shows a vertical DMOS device according to an exemplary embodiment of the present invention.

With reference to FIG. 4, similar to the DMOS device of FIG. 2, the vertical DMOS device includes an epitaxial layer 154 of a first conductivity type on a semiconductor substrate 150, a buried diffusion layer of the first conductivity type 152, a drain region of a first conductivity type 158 and a sink region 159 that are formed on the epitaxial layer 154, and a plurality of source regions 165a and 165b, which are separated by a device isolation layer 156 from the drain region 158 and formed on the epitaxial layer 154. The source regions 165a and 165b are formed in an epitaxial layer 154 defined by the drain region 158 and the sink region 159. The source regions 165a and 165b are two dimensionally arranged in a region surrounded by the drain region.

The first source region 165a, which is in close proximity to, the drain region 158 has a structure in which a first heavily doped diffusion layer 164a of a second conductivity type is formed in a first body region 160a of the second conductivity type. The second source region 165b which is isolated from the drain region 158, similar to a conventional DMOS device, has a structure in which a heavily doped diffusion layer of the first conductivity type 162 and a second heavily doped diffusion layer of the second conductivity type 164b are formed in a second body region 160b of the second conductivity type. For example, in fabricating a DMOS device with a source cell structure with a matrix or a honeycomb structure, edge source cells close to the drain region may be formed in a structure similar to the first source region 165a, and center source cells may be formed in a structure similar to the second source region 165b. Also, drain contact plugs 174 are disposed on the drain regions 158, and source contact plugs 172 are disposed on the first and second source regions 165a and 165b. The drain contact plugs 174 are connected to a drain interconnection line 300D, which may be coupled to a load voltage $V_d$, and source contact plugs 172 are connected to a source interconnection line 300S, which may be coupled to a ground voltage $V_s$.

Gate electrode 170 are formed by interposing a gate insulating layer 166 on the epitaxial layer 154. The gate electrodes 170 are connected to a gate interconnection line 300G. which may be coupled to a control signal $V_g$. Similar to a gate electrode of a conventional DMOS device, the gate electrode may have a mesh-shaped structure in which source regions are exposed.

The gate electrode 170 is overlapped with the second body region 160b comprised of a plurality of DMOS transistors having a channel on a surface of the second body region of the second conductivity type 160b between the heavily doped diffusion layer of the first conductivity type 162 and the epitaxial layer of the first conductivity type. Since the DMOS device includes a plurality of bipolar transistors, a strong stress current is divided to the plurality of bipolar transistors and the diode. Accordingly, a thermal breakdown of the DMOS device can be prevented.

As previously mentioned, in the DMOS device having a plurality of source regions isolated from the drain region, the diode is operated by changing an impurity diffusion structure of a source region neighboring the drain region. Therefore, a strong current path is formed in ESD or EOS so that the breakdown of the device can be prevented.

That is, a current path to the source region in close proximity to the drain region that cannot endure EOS or ESD is cut off by a diode, and a current flows vertically through a low resistance path via a buried diffusion layer in a source region isolated from the drain region. As a result, the current is not concentrated but divided, thereby preventing the breakdown of the device.

Having described the exemplary embodiments of the present invention, it is further noted that is readily apparent to those of reasonable skill in the art that various modifications may be made without departing from the spirit and scope of the invention which is defined by the metes and bounds of the appended claims.

What is claimed is:

1. A Vertical Double-Diffused Metal Oxide Semiconductor (VDMOS) device comprising:
a drain region of a first conductivity type formed on an epitaxial layer of the first conductivity type, a plurality of double diffusion source regions isolated from the drain region formed on the epitaxial layer, and a gate electrode formed over the epitaxial layer to overlap with an upper portion of a part of the source region;
wherein the plurality of double diffusion source regions comprise a first source region and a second source region, the first source region is in close proximity to the drain region and consists of a first diffusion structure which consists of a body region of a second conductivity type and a heavily doped diffusion layer of the second conductivity type formed in the body region,
wherein the second source region is a second diffusion structure in which a heavily doped diffusion layer of the first conductivity type and a heavily doped diffusion layer of the second conductivity type are formed in a body region of the second conductivity type.

2. The VDMOS device of claim 1, wherein the source region of the first diffusion structure and the source region of second diffusion structure are connected with interconnections.

3. The VDMOS device of claim 1, wherein when an Electro-Static Discharge (ESD) or an Electrical Over Stress (EOS) is applied to the drain region, the drain region and the source region of the first diffusion structure operate as a diode, and the drain region and the source region of the second diffusion structure operate as a bipolar transistor.

4. The VDMOS device of claim 3, wherein, a breakdown voltage of the diode is higher than a turn-on voltage of the bipolar transistor.

5. The VDMOS device of claim 1, wherein when a control signal is applied to the gate electrode, a channel of a MOS transistor is formed in the body region of the second conductivity type of the second diffusion structure.

6. The VDMOS device of claim 5, wherein when the ESD or the EOS is applied to the drain region, the drain region and the source region of the first diffusion structure operate as a diode, and the drain region and the source region of the second diffusion structure operate as a bipolar transistor, and
wherein the turn-on voltage of the bipolar transistor is higher than a threshold voltage of the MOS transistor,
wherein a reverse breakdown voltage of the diode is higher than the turn-on voltage of the bipolar transistor.

7. A Vertical Double-Diffused Metal Oxide Semiconductor (VDMOS) device comprising:
an epitaxial layer of a first conductivity type formed on a substrate;
a buried diffusion layer of the first conductivity type formed at an interface portion of the epitaxial layer and the substrate;
a drain region of the first conductivity type formed in an upper part of the epitaxial layer; and
a plurality of source regions isolated from the drain region to be formed in the upper part of the epitaxial layer,
wherein the source regions comprise:
a first source region in close proximity to the drain region, the first source region consisting of a first body region of a second conductivity type and a first heavily doped diffusion layer of the second conductivity type formed in the first body region; and
a second source region comprising a second body region, a first heavily doped diffusion layer of the first conductivity type formed in the second body region, and a second heavily doped diffusion layer of the second conductivity type.

8. The VDMOS device of claim 7, wherein the first source region and the second source region are connected to each other with interconnections.

9. The VDMOS device of claim 7, wherein when an Electro-Static Discharge (ESD) or an Electrical Over Stress (EOS) is applied to the drain region, the drain region, the epitaxial layer and the first source region operate as a diode.

10. The VDMOS device of claim 7, wherein when an ESD or an EOS is applied to the drain region, the drain region, the epitaxial layer and the second source region operate as a diode.

11. The VDMOS device of claim 10, wherein the heavily doped diffusion layer of the first conductivity type, the second body region and the epitaxial layer operate as a bipolar transistor, the bipolar transistor comprises the heavily doped diffusion layer of the first conductivity type as an emitter region, the second body region as a base region, and the epitaxial layer as a collector region.

12. The VDMOS device of claim 7, wherein when an ESD or the EOS is applied, the epitaxial layer and the first source region operate as a diode, and the epitaxial layer and the source region operate as a bipolar transistor,
wherein a turn-on voltage of the bipolar transistor is lower than a reverse breakdown voltage of the diode.

13. The VDMOS device of claim 7, further comprising:
a gate insulating layer formed on the epitaxial layer; and
a gate electrode formed on the gate insulating layer overlapped with a first body region and a second body region, wherein the first body region is located between the first heavily doped diffusion layer of the second conductivity type and the epitaxial layer, wherein the second body region is located between the heavily doped diffusion layer of the first conductivity type and the epitaxial layer.

14. The VDMOS device of claim 13, wherein when a control signal is applied to the gate electrode, a channel of a Metal Oxide Semiconductor (MOS) transistor is formed in the second body region between the heavily doped diffusion layer of the first conductivity type and the epitaxial layer.

15. The VDMOS device of claim 14, wherein when the Electro-Static Discharge (ESD) or the Electrical Over Stress (EOS) is applied, the epitaxial layer and the first source region operate as a diode, and the epitaxial layer and the source region operate as a bipolar transistor, wherein the turn-on voltage of the bipolar transistor is lower than the reverse breakdown voltage of the diode.

16. The VDMOS device of claim 15, wherein the bipolar transistor comprises the epitaxial layer as a collector region, the second body region as a base region, and the heavily doped diffusion layer of the first conductivity type as an emitter region.

17. The VDMOS device of claim 15, wherein a threshold voltage of the MOS transistor is lower than the turn-on voltage of the bipolar transistor, wherein the turn-on voltage of the bipolar transistor is lower than the reverse breakdown voltage of the diode.

* * * * *